United States Patent [19]

Schreck et al.

[11] Patent Number: 6,049,483

[45] Date of Patent: Apr. 11, 2000

[54] NONVOLATILE MEMORY DEVICE HAVING PROGRAM AND/OR ERASE VOLTAGE CLAMP

[75] Inventors: John F. Schreck, Lucas; David J. McElroy; Brian W. Huber, both of Allen, all of Tex.

[73] Assignee: Texas Instruments Incorporated, Dallas, Tex.

[21] Appl. No.: 09/368,453

[22] Filed: Aug. 3, 1999

Related U.S. Application Data

[60] Provisional application No. 60/096,034, Aug. 11, 1998.

[51] Int. Cl.[7] .................................................... G11C 16/14
[52] U.S. Cl. .............................. 365/185.27; 365/185.2; 365/185.23; 365/185.29
[58] Field of Search ........................... 365/185.2, 185.23, 365/185.27, 185.29

[56] References Cited

U.S. PATENT DOCUMENTS

| | | | |
|---|---|---|---|
| 4,718,041 | 1/1988 | Baglee et al. | 365/185.22 |
| 4,763,305 | 8/1988 | Kuo | 365/185.22 |
| 4,805,151 | 2/1989 | Terada et al. | 365/185.22 |

*Primary Examiner*—Andrew Q. Tran
*Attorney, Agent, or Firm*—Robby T. Holland; Carlton H. Hoel; Frederick J. Telecky, Jr.

[57] ABSTRACT

Circuits for applying a programming voltage and erase voltage to memory cells in a nonvolatile memory device are disclosed. The reverse breakdown of p-n junctions within the memory cells is prevented by providing a clamping p-n junction in the path used to apply the program or erase voltage to the memory cells. The clamping p-n junction will breakdown before the p-n junctions within the memory cells, protecting the memory cells from the adverse effects of a reverse breakdown condition.

40 Claims, 5 Drawing Sheets

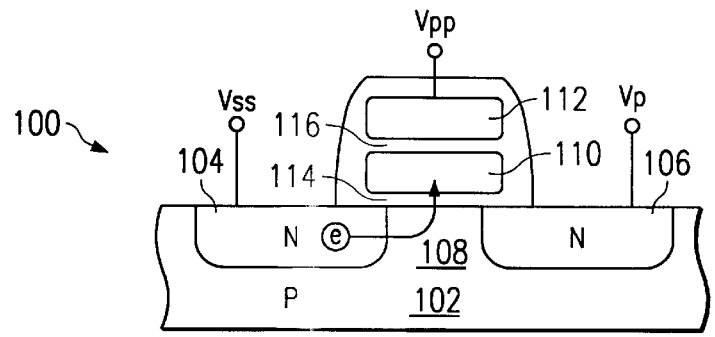
FIG. 1 (PRIOR ART)
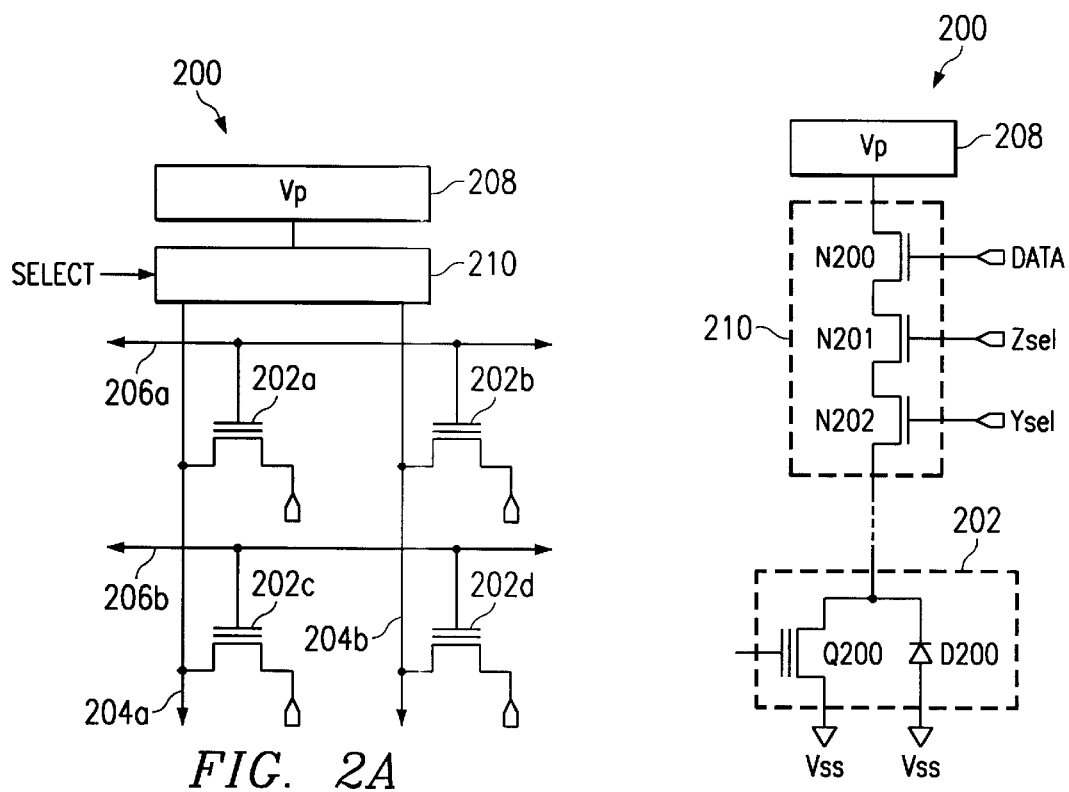
FIG. 2A (PRIOR ART)
FIG. 2B (PRIOR ART)
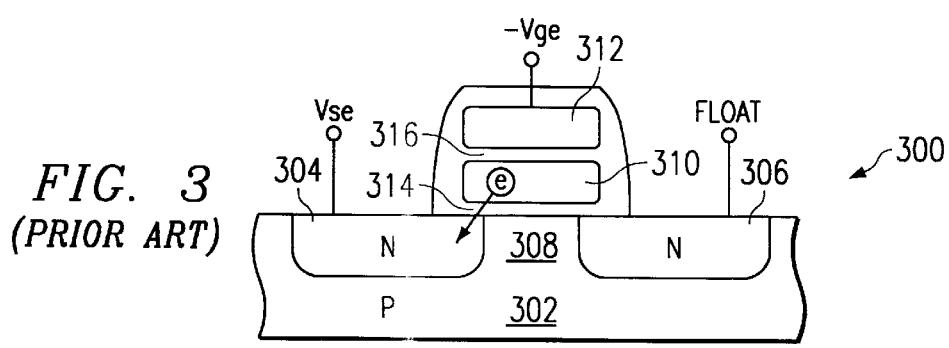
FIG. 3 (PRIOR ART)

NONVOLATILE MEMORY DEVICE HAVING PROGRAM AND/OR ERASE VOLTAGE CLAMP

This application claims priority under 35 USC §119(e)(1) of provisional application Ser. No. 60/096,034 filed Aug. 11, 1998.

TECHNICAL FIELD

The present invention relates generally to semiconductor memory devices, and more particularly to circuits for applying program and erase voltages to memory cells within a nonvolatile semiconductor memory device.

BACKGROUND OF THE INVENTION

Nonvolatile semiconductor memory devices often achieve nonvolatility (i.e., the ability to store data in absence of an applied power supply voltage) by the use of a charge storage mechanism. For example, charge may be stored in a "floating" gate (a conductive element surrounded by a dielectric) or at a dielectric interface, such as a silicon dioxide/silicon nitride interface.

In order to utilize charge storage mechanisms, an electric field must be generated to transport the charge from a source location to a destination location. An example of one type of mechanism is set forth in FIGS. 1, 2A and 2B. FIG. 1 sets forth a side cross sectional view of a nonvolatile memory device of a type that may be used in an electrically programmable read only memory (EPROM) or an electrically erasable and programmable memory (EEPROM). The memory device is a so-called "one-transistor" (1-T) memory cell, and is designated by the general reference character 100. The memory cell 100 is shown to be formed in a p-type semiconductor substrate 102, and includes an n-type source region 104 and f-type drain region 106, separated by a channel region 108. A floating gate 110 and a control gate 112 are formed over the channel region 108. The floating gate 110 is separated from the substrate 102 by a first dielectric 114, which may be a tunnel dielectric in the case of an EEPROM. The floating gate 112 is separated from the control gate 112 by a second dielectric 116.

The prior art 1-T cell 100 is programmed by placing electrons on the floating gate 110 by the charge transport mechanism known as hot electron injection. A first field is created by placing the source region 104 at a low potential (Vss) and the drain region 106 at a high potential (Vp). This first field accelerates electrons from the source region 104 into the channel 108. A second field across the floating gate 110, created by capacitive coupling, is generated by applying a very high potential (Vpp) to the control gate 116. As the first field accelerates the electrons into the channel 108, they are attracted toward the floating gate 110 by the second field, and then trapped in the floating gate 110. A symbolic representation of an electron being accelerated from the source region 104, across the channel 108, and into the floating gate 110 is set forth in FIG. 1.

The 1-T cell 100 essentially functions as an insulated gate field effect transistor (IGFET), with the threshold voltage being altered by the amount of charge that is stored in the floating gate 110.

FIG. 2A is a block schematic diagram illustrating a portion of a nonvolatile memory device 200, including those structures necessary for applying the high drain voltage Vp, required in a programming operation. The memory device 200 includes four 1-T cells 202a–202d, arranged in two rows and two columns. Cells within the same column are commonly coupled to a bit line 204a and 204b. Cells within the same row are commonly coupled to a row line 206a and 206b. The bit lines 204a and 204b are coupled to a drain programming voltage (Vp) source 208 by a column selector 210. In operation, SELECT signals are applied to the column selector 210, and in response thereto, the column selector 210 couples the voltage Vp to selected bit lines, and consequently, to the drains of those memory cells coupled to the selected bit lines. It is understood that at the same time the voltage Vp is applied to the drains of the selected memory cells, the gates of the memory cells within a selected row are driven to the very high Vpp voltage. The sources of the memory cells are maintained at the low voltage Vss.

FIG. 2B provides a more detailed schematic diagram illustrating the application of the voltage Vp to the drain of one memory cell. A memory cell 202 is represented by a typical 1-T cell symbol Q200. In addition, a diode D200 is shown in parallel with the 1-T symbol. The diode represents the p-n junction created by the n-type source region formed within the p-type substrate. The drain of the memory cell 202 (the cathode of diode D200) is coupled to the Vp voltage source by the column selector 210, which includes three n-channel metal-oxide-semiconductor (MOS) transistors (N200, N201 and N202) connected in series. Transistors N201 and N202 are driven by column select signals Ysel and Zsel, which can be generated from address decoder circuits. Transistor N200 is driven by a DATA signal, representative of the data that is to be written into the memory cell 202. For example, if a logic "0" is to be written into the memory cell 202 the DATA signal would be high, and the memory cell 202 would be programmed. If a logic "1" is to be written, the DATA signal would be low, and the memory cell 202 would not be programmed.

A drawback to the programming arrangement set forth in FIGS. 1, 2A and 2B is the possibility that the drain voltage may exceed the reverse breakdown voltage of the drain-source diode. A reverse breakdown condition at the drain p-n junction can give rise to a number of undesirable effects. The breakdown of the p-n junction can lead to the generation of high-energy "hot" holes. These hot holes can be injected into the oxide that separates the substrate from the floating gate. Such trapped hot holes have been attributed to contributing in the breakdown of the oxide, resulting in higher leakage current and/or decreased reliability in the memory cell operation. In addition, it is believed that such trapped holes can subsequently migrate to the floating gate 110/oxide 114 interface and cancel the effect of electrons stored in the floating gate 110. The threshold voltage of a programmed cell can be lowered.

The reverse breakdown of the drain diode also impacts the controllability of programming. With the breakdown of the junction, the carrier generation mechanism becomes dominated by band to band tunneling, instead of hot carriers. As a result, the ability to control the amount of charge that is stored within the floating gate may be impacted, adversely affecting the resulting threshold voltage of the nonvolatile storage device.

The breakdown of the p-n junction in a nonvolatile memory cell may also occur in the erase operation of an EEPROM cell. Referring now to FIG. 3, a 1-T EEPROM cell is set forth in a side cross sectional view, and designated by the general reference character 300. As in the case of the memory cell 200 set forth in FIG. 1, the 1-T EEPROM cell 300 is formed in a p-type semiconductor substrate 302, has an n-type source region 304 and an n-type drain region 306 separated by a channel 308. A floating gate 310 and control gate 312 is formed above the channel 308. The first dielectric of the memory cell 300 is a tunnel dielectric 314; the second dielectric 316 is an intergate dielectric.

In the particular example set forth in FIG. 3, the erasure of the cell is accomplished by tunneling electrons stored on the floating gate 310 to the source region 304. A relatively large negative gate erase voltage (–Vge) is applied to the control gate 312, the source region 304 receives a positive voltage Vse, and the drain region 306 is placed into a floating (high impedance) state. Due to the relatively large negative voltage (–Vge) at the control gate 312, and the positive voltage (Vse) at the source regions 304, an electric field is created between the floating gate 310 and the source region 304 causing electrons to tunnel from the floating gate 310 through the tunnel dielectric 314 to the source region 304.

FIG. 4A is block diagram illustrating the application of the source erase voltage Vse to the sources of the memory cells in an EEPROM. The portion of the EEPROM is designated by the reference character 400 and has many of the same elements as the EEPROM in FIG. 2A, including four, 1-T memory cells 402a–402d, two bit lines 404a and 404b, and two word lines 406a and 406b. In the particular embodiment of FIG. 4A the sources of the memory cells (402a–402d) are commonly coupled to a source erase voltage Vse 410, by a source selector 412. A detailed schematic diagram in FIG. 4B illustrates the application of the voltage Vse to one memory cell 402. The Vse voltage is generated in the Vse source 410, and applied to the source of the memory cell 402 by a source selector 412 that includes a complementary MOS (CMOS) driver, composed of p-channel MOS transistor P400 and n-channel MOS transistor N400. During an erase operation, a SELECT signal at the gates of transistors P400 and N400 goes low, applying the Vse voltage to the source of the memory cell 402. The memory cell 402 is represented by 1-T cell symbol Q400, with the p-n junction created by the source regions being represented by a diode D400.

As in the case of the programming operation described above, it is desirable to avoid the reverse breakdown of the source-substrate p-n junction during an erase operation, as this leads to the generation hot holes, and the adverse consequences thereof.

It would be desirable to reduce the adverse effects of junction breakdown during the programming and erase operation of nonvolatile memory cells.

SUMMARY OF THE INVENTION

The preferred embodiment includes a circuit for applying voltages to the p-n junctions of a nonvolatile memory cell in a program or an erase operation. The circuit includes a voltage application path that couples a voltage source to p-n junctions within the nonvolatile memory cell. In addition, a clamping p-n junction is incorporated into the voltage application path at a position that is closer to the voltage source than the nonvolatile memory cell. As the voltage provided by the voltage source rises in magnitude, the clamping p-n junction will reach a reverse breakdown condition before the p-n junction within the nonvolatile memory device, protecting the nonvolatile memory cell from the adverse effects of a reverse breakdown condition.

According to one aspect of the present invention, the nonvolatile memory cell includes a source region, a drain region, and a floating gate. The voltage source supplies a programming voltage to a p-n junction formed by the drain region.

According to another aspect of the present invention, the nonvolatile memory cell includes a source region, a drain region, and a floating gate. The voltage source supplies an erase voltage to a p-n junction formed by the source region.

According to another aspect of the present invention, the voltage application path includes a select circuit that couples the voltage source to the nonvolatile memory device in response to select signals generated by an address decode circuit. The clamping p-n junction is situated between the voltage source and the select circuit.

According to another aspect of the present invention, the p-n junctions within the nonvolatile memory device are n-type regions formed within a p-type semiconductor substrate. The voltage source supplies a positive voltage.

According to another aspect of the present invention, the clamping p-n junction is a source or drain region of a dummy nonvolatile memory device.

BRIEF DESCRIPTION OF THE DRAWINGS

FIG. 1 is a side cross sectional view of a 1-T nonvolatile memory cell during a program operation.

FIGS. 2A and 2B are block schematic diagrams of a prior art circuit for applying a programming voltage to the drains of 1-T memory cells in a nonvolatile memory device.

FIG. 3 is a side cross sectional view of a 1-T nonvolatile memory cell during an erase operation.

DETAILED DESCRIPTION OF THE EMBODIMENTS

Figure 4A:
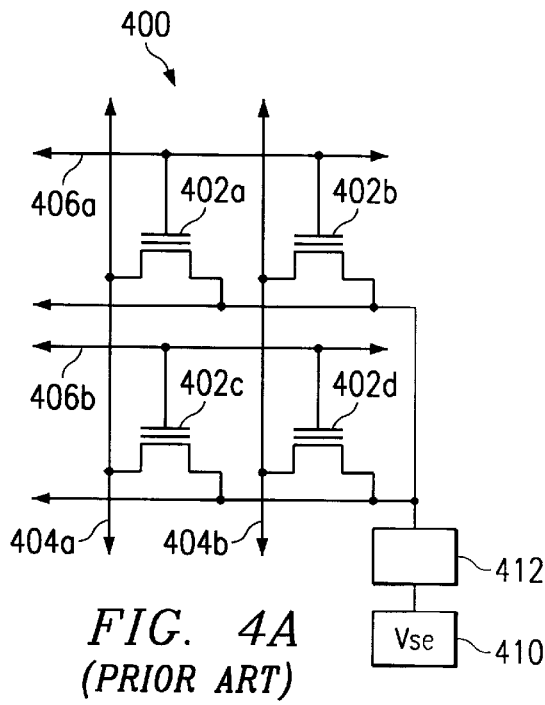
FIGS. 4A and 4B are block schematic diagrams of a prior art circuit for applying an erase voltage to the sources of 1-T memory cells in a nonvolatile memory device.
Figure 4B:
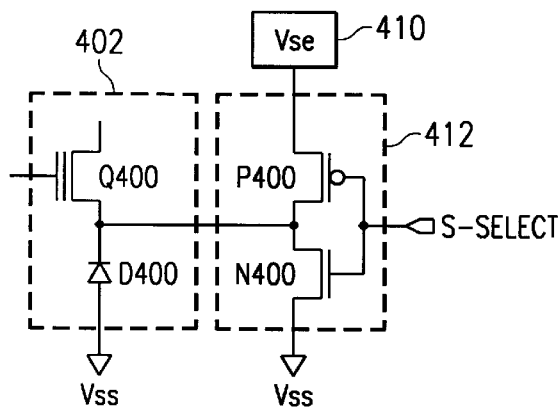
Figure 5:
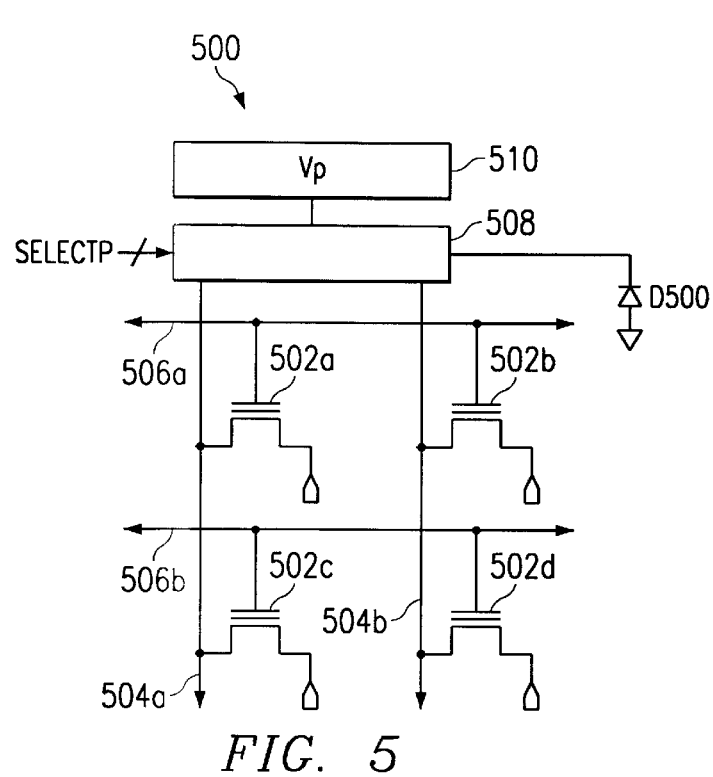
FIG. 5 is a block schematic diagram of a preferred embodiment.

The preferred embodiment is a circuit for applying a program voltage (Vp) to the drain of a selected memory cell. The preferred embodiment is set forth, generally, in a schematic block diagram in FIG. 5, and designated by the general reference character 500. The preferred embodiment 500 is shown to include an array of 1-T memory cells, shown as items 502a–502d. The memory cells of the same column are commonly coupled to the same bit lines 504a or 504b, and the memory cells (502a–502d) of the same row are commonly coupled to the same word line 506a or 506b. A column select circuit 508 couples the bit lines 504a and 504b to a Vp voltage source 510. In addition, clamping device p-n junction, shown as diode D500 is shown connected in parallel to the column select circuit 508.

In operation, the diode D500 serves as a voltage clamp for the program voltage Vp. For example, if memory cell 502a was to be programmed, the word line 506a would be driven to a very high voltage Vpp, while the source of the memory cell 502a is coupled to the low supply voltage Vss. In response to select signals, SELECT, the column select circuit 508 would couple the program voltage Vp to the drain of the memory cell 502a, by way of bit line 504a. In the event the program voltage Vp exceeds the breakdown voltage of the clamping device D500, current will pass through the clamping device D500. The breakdown voltage of the clamping device D500 is selected to be less than or equal to the breakdown voltage of the drain-substrate p-n junction of the memory cell 502a. As a result, the voltage at the drain of the memory cell 502a is prevented from ever reaching a breakdown condition, and the memory cell 502a will not suffer from the adverse effects thereof.

The grading of the clamp diode junction can effect the final voltage clamp limit. This grading can be controlled by limited source diffusion effects (i.e. a very small implant region [such as about 0.5 microns square] will result in limited source diffusion effects which will in turn result in a more graded junction.) A more graded junction will raise the clamping voltage. The clamping diode should be manufactured so that it does not result in limited source diffusion effects. Preferably, it should not be long and narrow so as to avoid wasted area without good clamping margin. It should be laid out in a square with large enough dimensions to avoid limited source diffusion effects. This will ensure that the clamp voltage is below the voltage in the array that will induce problems. Of course, the square requirement can be ignored, but then the minimum size of the diode to achieve the same clamping IV point will be increased so area efficiency will drop.

Figure 6A:
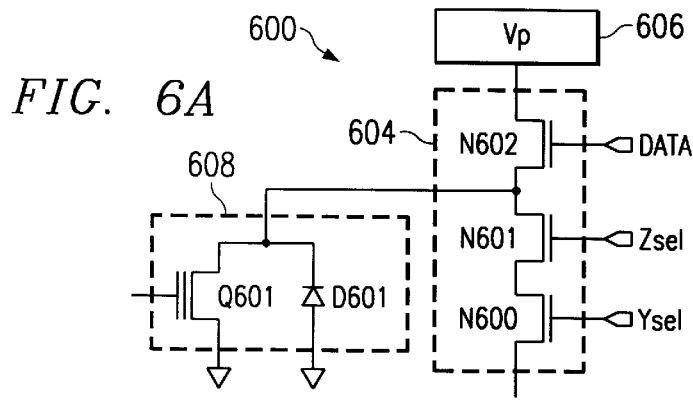
FIGS. 6A–6C are schematic diagrams illustrating various embodiments.

FIG. 6A provides a more detailed illustration of one version of the preferred embodiment. The circuit of FIG. 6A is designated by the general reference character 600, and includes a memory cell 602, a column selector 604, a Vp voltage source 606, and a clamp structure 608. The memory cell 602 is represented by a 1-T transistor cell symbol Q600 in parallel with a diode D600. The diode D600 is provided to illustrate the p-n junction formed by the n-type drain diffusion of the memory cell Q600 which is formed in a p-type substrate. The column selector 604 of the circuit 600 is shown to include three n-channel transistors N600, N601 and N602 connected in series. Transistor N600 is driven by a Yse1 signal, and transistor N601 is driven by a Zse1 signal. The Yse1 and Zse1 signals are generated from address decode circuits (not shown). Transistor N602 is driven by a data signal DATA. The signal DATA is driven high or low depending upon the which logic level ("1" or "0") is to be written to the memory cell 602. The Vp voltage source 606 applies a Vp voltage to the drain of transistor N602.

The clamping structure 608 is coupled in parallel to the conductive path of the column selector 604 at the source-drain connection of transistors N602 and N601. In the particular embodiment of FIG. 6A, the clamping structure 608 is a "dummy" memory cell that is represented by a 1-T cell symbol Q601 in parallel with a diode D601. A dummy memory cell is a memory cell that is not used for storage of data, but instead, provides the same response as a standard memory cell (i.e., a memory cell used to store data) for some circuit application. The dummy cell is typically fabricated at the same time as the standard memory cells (using the same fabrication steps). It is understood that the dummy memory cell does not have to be the same size as the standard memory cells. The diode D601 represents the p-n junction formed by the n-type source of the dummy memory cell, which is formed in a p-type substrate. The gate of transistor Q601 may be at the supply voltage Vss to prevent current flow through the dummy memory cell.

In a program operation, if the memory cell 602 corresponds to an applied address, the Zse1 and Yse1 signals will go high. In the event a logic "0" is to be written into the memory cell, the data signal will be high, coupling the program voltage Vp through the source-drain path of the transistors N600, N601 and N602 to the drain of the memory cell 602. The source-drain paths of the transistors N600–N602 introduce some voltage drop, therefore the voltage at the source of transistor N602 will be greater than the voltage at the drain of the memory cell 602. Thus, provided the breakdown voltage of the clamping structure 608 (D601) is equal to, or less than, the breakdown voltage of the drain p-n junction of the memory cell 602 (D600), the clamping structure 608 will reach the breakdown voltage first, and protect the drain memory cell 602 from an breakdown condition.

Figure 6B:
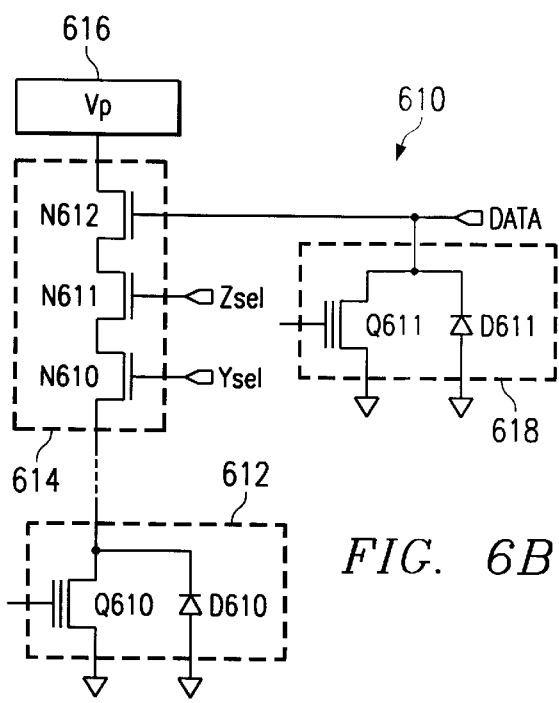

FIG. 6B illustrates a second variation of the preferred embodiment. The embodiment of FIG. 6B is designated by the reference character 610, and includes many of the same elements as the circuit set forth in FIG. 6A; a memory cell 612, a column selector 614, a Vp voltage source 616, and a clamp structure 618. The column selector 614 includes n-channel MOS transistor N610, which receives a Yse1 signal, n-channel MOS transistor N611, which receives a Zse1 signal, and n-channel MOS transistor N612, which receives a DATA signal. Unlike the embodiment of FIG. 6A the clamping structure 618 is coupled to the gate of transistor N612. This arrangement results in the voltage at the gate of transistor N612 being clamped to the breakdown voltage (Vbd) of the clamping structure 618. Consequently, the voltage at the source of transistor N612 is limited to Vbd-Vtn, where Vtn is the threshold voltage of the transistor N612. Again, provided the Vbd of the clamping structure 618 is less than or equal to that of the p-n junction within the memory cell Q610, the clamping structure 618 diode D611 will prevent a breakdown condition in the drain diode D610 from occurring.

Figure 6C:
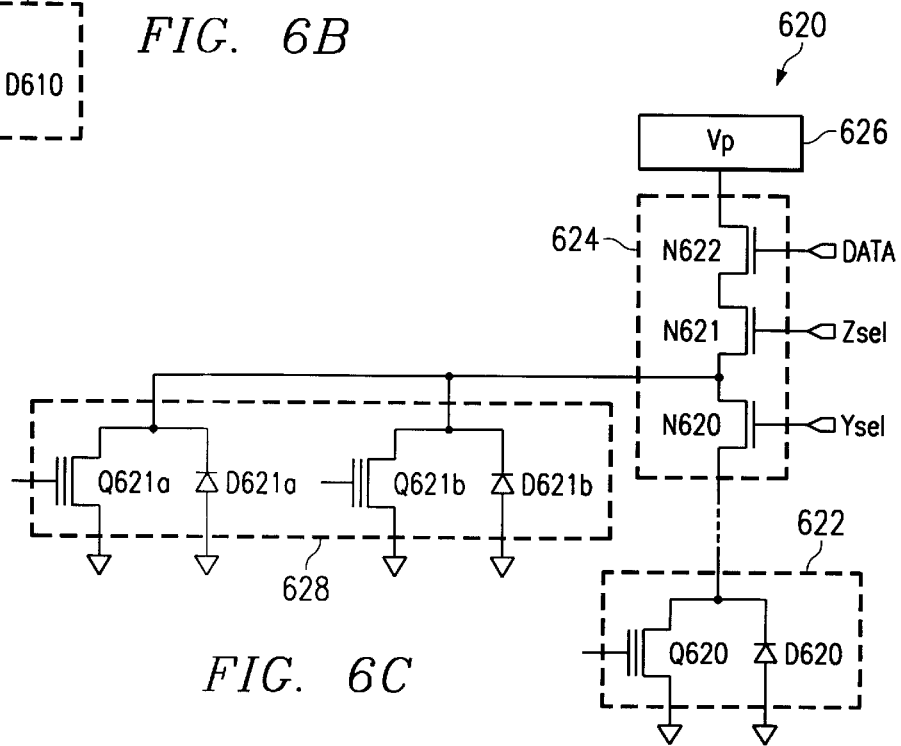

Referring now to FIG. 6C another embodiment is set forth illustrating another clamping approach. The circuit is designated by the reference character 620 and includes a memory cell 622 (represented by 1-T memory cell Q620 and diode D620), a column selector 624 (including series connected n-channel MOS transistors N620, N621 and N622), and program voltage Vp source 626. In the circuit 620 of FIG. 6C, clamping device 628 achieves a reduced breakdown voltage (a breakdown voltage less than that of diode D620) by utilizing two dummy memory cells in parallel. The two dummy memory cells are represented by 1-T transistor symbols Q621a and Q621b, and diodes D621a and D621b.

Figure 7:
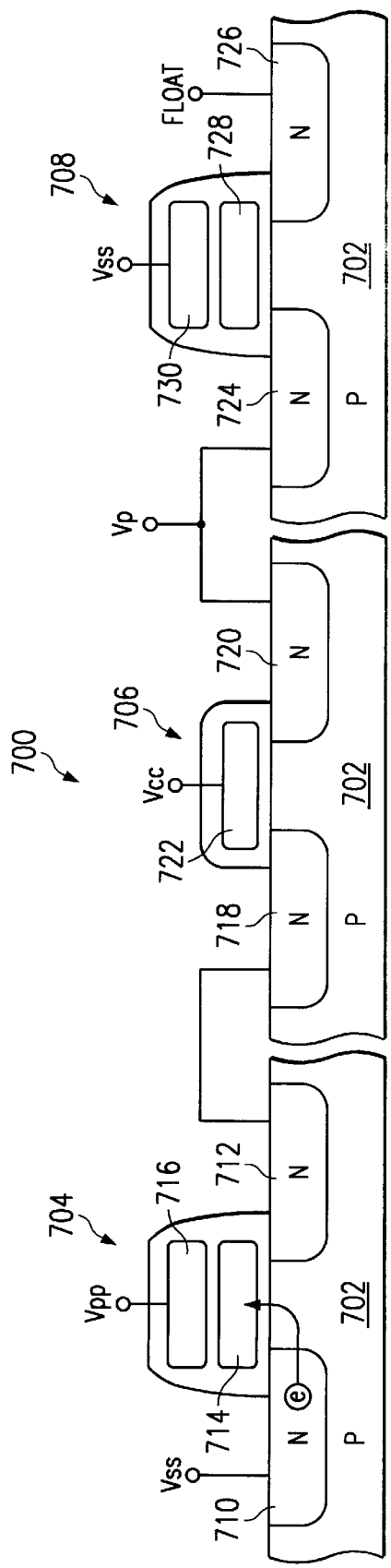
FIG. 7 is a side cross sectional view of one implementation of the preferred embodiment in a semiconductor device.

It is understood that the various embodiments set forth in FIGS. 5 and 6A–6C could be subject to further variation. The memory cells need not be "stacked gate" 1-T memory cells, and could be "split" gate cells or cells employing access transistors that are separated from a charge storage structure. The structures used to apply the program voltage to the drain of the memory cells could, of course, include p-channel MOS transistors. Further, the while the preferred embodiment is described in connection with a binary storage memory cells, the clamping device may also be employed in ternary or other multiple level storage devices. Referring now to FIG. 7, a side cross sectional view of a semiconductor memory device 700 is set forth, illustrating one implementation of the circuits set forth in FIGS. 6A and 6C. A p-type semiconductor substrate 702 has a 1-T memory cell 704, an n-channel MOS transistor 706, and a clamping device 708 formed therein. The memory cell 704 includes a source region 710, a drain region 712, a floating gate 714, and a control gate 716. The n-type drain region 712, in combination with the p-type substrate 702, forms a p-n junction.

The drain region 712 of the memory cell 704 is connected directly, or by way of other transistors (not shown), to a source region 718 of the transistor 706. The transistor 706 is shown to further include a drain region 720 and a gate 722. The drain region 720 of the transistor 706 may be connected directly, or by way of other devices, to the clamping device 708. The clamping device 708 is a dummy memory cell, having a drain region 724, a source region 726, a floating gate 728, and a control gate 730.

In a programming operation, a programming voltage (Vp) is applied, either directly or by way of other devices, to the drain region 720 of the transistor. The programming voltage (Vp) may be the positive power supply, or alternatively, a higher voltage generated by charge pumps or the like, and is typically applied as a pulse, or a series of pulses. The transistor 706 is turned on by the application of a positive power supply voltage Vcc to its gate 722. The Vp voltage is applied through the conductive channel of the transistor 706, directly, or by way of other devices, to the drain region 712 of the memory cell 704. The source region 710 of the memory cell 704 is at the low power supply voltage Vss, and the control gate 716 has a very high voltage Vpp. The voltage Vpp may be in the range of +11 volts, and may be generated by a charge pump circuit or the like. Electrons are accelerated into the channel of the memory cell 704, and then swept into the floating gate 714.

At the same time, the Vp voltage is also applied to the drain region 724 of the dummy memory cell 708. The control gate 730 of the dummy memory cell 708 is at the low power supply voltage Vss, and the source region 726 is left floating.

In the event the Vp voltage exceeds the breakdown voltage for p-n junctions fabricated within the device, the p-n junction formed by the n-type drain region 724 the dummy memory cell 708 will breakdown before the drain region 712 of the memory cell 704, protecting the memory cell 704 from the adverse effects of junction breakdown.

While the embodiments described above protect the p-n junctions of nonvolatile memory cells in a programming operation, alternate embodiments may also protect p-n junctions of nonvolatile memory cells during erase operations. One such alternate embodiment is set forth in FIG. 8.

Figure 8:
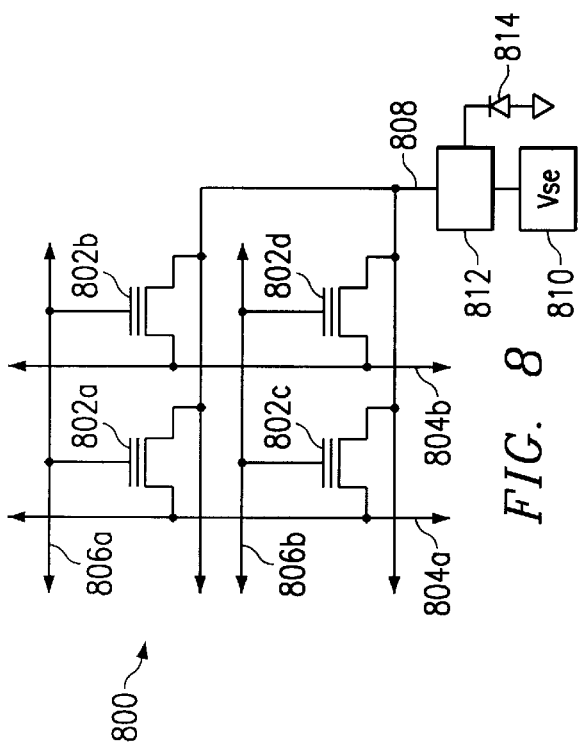
FIG. 8 is a block schematic diagram illustrating an alternate embodiment.

The alternate embodiment circuit of FIG. 8 is designated by the general reference character 800 and includes memory cells 802a–802d arranged in rows and columns, and coupled to bit lines 804a and 804b, and word lines 806a–806b. The memory cells (802a–802d) have their sources commonly coupled to a source node 808. The source node 808 is coupled to a source erase voltage Vse 810 by a source select circuit 812. A clamping device 814 (shown as a diode) is provided in parallel with the select circuit 812. In the event the Vse voltage exceeds the breakdown voltage of the p-n junctions within the device 800, the clamping device 814 will breakdown, preventing the overvoltage from being applied to the source node 808, and hence the sources of the memory cells (802a–802d).

Figure 9:
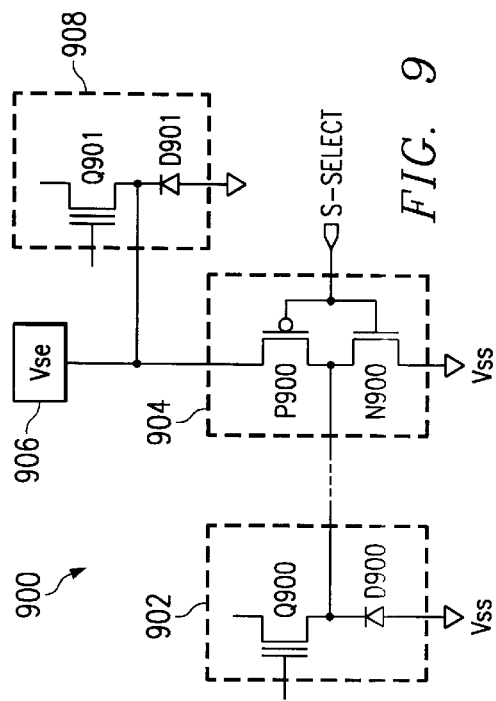
FIG. 9 is a schematic diagram of the alternate embodiment.

A more detailed circuit for the alternate embodiment is set forth in FIG. 9. The circuit is designated by the general reference character 900 and shown to include a memory cell 902 represented by the 1-T cell symbol Q900 and diode D900. Diode D900 is provided to illustrate the p-n junction formed by the n-type source of the memory cell 902, which is formed in a p-type substrate. A select circuit 904 is shown to include p-channel MOS transistor P900 and n-channel MOS transistor N900 configured as a CMOS driver. The source of the transistor N900 is coupled to a low power supply Vss and the source of transistor P900 is coupled to a source erase (Vse) voltage supply 906. The common gates of transistors N900 and P900 receive a source select signal S-SELECT. The common drains of transistors N900 and P900 drive the source of the memory cell 902 (the anode of diode D900).

Also coupled to the source of transistor P900, in series with the source select circuit 904, is clamping device 908. The clamping device 908 is a dummy memory cell, represented by 1-T cell symbol Q901 and diode D901. The diode D901 is included to represent the p-n junction formed by the n-type source of the dummy memory cell 908, which is formed within a p-type substrate.

During an erase operation, a source erase voltage is generated at the Vse voltage supply 906. If the memory cell 902 is to be erased, the signal S-SELECT is low, transistor P900 is turned on, and the Vse voltage is coupled to the source of the memory cell 902. The clamping device 908 may be manufactured with the same fabrication steps as the memory cell 902, to give diode D901 the same breakdown characteristics as diode D900. The voltage drop inherent in the source (which may be a common diffusion region) may be relied upon to introduce a voltage drop between the Vse voltage supply 906 and the source of the memory cell 902. Such an arrangement would result in the diode D901 breaking down before diode D900, protecting the memory cell 902 from a source-substrate breakdown. Alternatively, parallel clamping devices, different size dummy cells, or dummy cells fabricated using different techniques, can be used to create a clamping device 908 having a lower breakdown voltage than the diode D900 of the memory cell 902.

Figure 10:
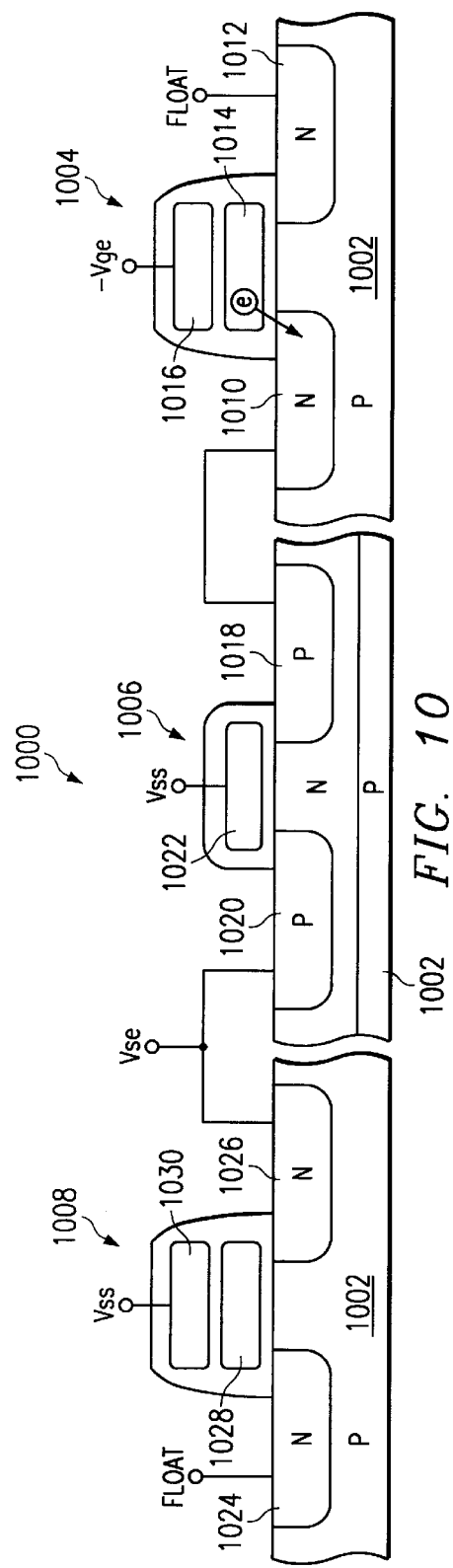
FIG. 10 is a side cross sectional view of one implementation of the alternate embodiment in a semiconductor device.

Referring now to FIG. 10, a side cross sectional view of a semiconductor memory device 1000 is set forth, illustrating one implementation of the circuit set forth in FIG. 9. A p-type semiconductor substrate 1002 has a 1-T memory cell 1004, a p-channel MOS transistor 1006, and a clamping device 1008 formed therein. The memory cell 1004 includes a source region 1010, a drain region 1012, a floating gate 1014, and a control gate 1016. The n-type source region 1010, in combination with the p-type substrate 1002, forms a p-n junction.

The source region 1010 of the memory cell 1004 is connected to a drain region 1018 of the transistor 1006. The transistor 1006 is shown to further include a source region 1020 and a gate 1022. The source region 1020 of the transistor 1006 is connected to the clamping device 1008. The clamping device 1008 is a dummy memory cell, having a drain region 1024, a source region 1026, a floating gate 1028, and a control gate 1030.

In a programming operation, a source erase voltage (Vse) is applied to the source region 1020 of the transistor 1006. The Vse voltage may be the positive power supply, or alternatively, a higher voltage generated by charge pumps or the like. The transistor 1006 is turned on by the application of a low power supply voltage Vss, to its gate 1022. The voltage Vss may be zero volts. The Vse voltage is applied through the conductive channel of the transistor 1006 and applied to the source region 1010 of the memory cell 1004. The drain region 1012 is left floating, and the control gate 1016 has a very high negative voltage −Vge. The voltage −Vge may be in the range of −9 volts, and may be generated by a charge pump circuit or the like. Electrons tunnel from the floating gate 1014 of the memory cell 1004 to the source 1010 of the memory cell 1004.

At the same time, the Vse voltage is also applied to the source region 1026 of the dummy memory cell 1008. The control gate 1030 of the memory cell 1008 is at the low power supply voltage Vss, and the drain region 1024 is left floating.

In the event the Vse voltage exceeds the breakdown voltage for p-n junctions fabricated within the device, the p-n junction formed by the n-type source region 1026 of the dummy memory cell 1008 will breakdown before the source region 1010 of the memory cell 1004, thus protecting the memory cell 1004. The earlier breakdown voltage achieved by the source-substrate junction of the dummy memory cell 1008 may be achieved by the various methods described in connection with FIG. 9.

Although the present invention has been described in detail, it should be understood that various changes, substitutions, and alterations could be made without departing from the spirit and scope of the invention as defined by the appended claims.

What is claimed is:

1. A circuit for applying a programming voltage to memory cells in a nonvolatile memory device, the circuit comprising:

a memory cell having a p-n junction;

a clamp node;

a select circuit coupled between the p-n junction of the memory cell and the clamp node, the select circuit including a controllable impedance path;

a program voltage supply node coupled to the clamp node; and a clamping p-n junction coupled to the clamp node.

2. The circuit of claim 1, wherein:

the memory cell includes a source region and a drain region, the drain region forming the memory cell p-n junction.

3. The circuit of claim 1, wherein:

the memory cell includes a floating gate.

4. The circuit of claim 1, wherein:

the p-n junction of the memory cell is formed by an n-type semiconductor region formed within a p-type semiconductor region.

5. The circuit of claim 1, wherein:

the memory cell is a one-transistor electrically programmable read only memory (EPROM) cell.

6. The circuit of claim 1, wherein:

the memory cell is a one-transistor electrically erasable and programmable read only memory (EEPROM) cell.

7. The circuit of claim 1, wherein:

the select circuit includes at least one insulated gate field effect transistor (IGFET) having a source-drain path disposed between the clamping node and the p-n junction of the memory cell.

8. The circuit of claim 7, wherein:

the select circuit includes a plurality of IGFETs having source-drain paths connected in series between the clamping node and the p-n junction of the memory cell, at least one of the IGFETs being activated in response to an externally applied address signal.

9. The circuit of claim 1, wherein:

the program voltage supply node is coupled to the clamping node by at least one IGFET having a source-drain path coupled between the program voltage supply node and the clamping node.

10. The circuit of claim 9, wherein:

the IGFET having the source-drain path coupled between the program voltage supply node and the clamping node is activated in response to a data signal representative of an externally applied data write signal.

11. The circuit of claim 1, wherein:

the memory cell p-n junction includes a cell semiconductor region of a first conductivity type and a cell semiconductor region of a second conductivity type, the cell region of the first conductivity type being coupled to the clamping node by the select circuit, the cell region of the second conductivity type being coupled to a first power supply voltage; and the clamping p-n junction includes a clamp semiconductor region of a first conductivity type and a clamp semiconductor region of a second conductivity type, the clamp region of the first conductivity type being coupled to the clamping node, the clamp region of the second conductivity type being coupled to the first power supply voltage.

12. The circuit of claim 1, wherein:

the first conductivity type is n-doped semiconductor material, and the second conductivity type is p-doped semiconductor material.

13. The circuit of claim 1, wherein:

the clamping p-n junction includes at least one dummy memory cell.

14. The circuit of claim 13, wherein:

the at least one dummy memory cell includes a source region and a drain region, the drain region forming the clamping p-n junction.

15. The circuit of claim 13, wherein:

the dummy memory cell includes a floating gate.

16. The circuit of claim 1, wherein:

the clamping p-n junction includes a plurality of dummy memory cells coupled in parallel to one another.

17. A circuit for applying a programming voltage to memory cells in a nonvolatile memory device, the circuit comprising:

a memory cell having a p-n junction;

a program voltage supply node;

a select circuit having a controllable impedance path coupled between the program voltage supply node and the p-n junction of the memory cell, the impedance of the impedance path being controlled by the voltage at a clamp node; and a clamping p-n junction coupled to the clamp node.

18. The circuit of claim 17, wherein:

the memory cell includes a source region and a drain region, the drain region forming the memory cell p-n junction.

19. The circuit of claim 17, wherein:

the p-n junction of the memory cell is formed by an n-type semiconductor region formed within a p-type semiconductor region.

20. The circuit of claim 17, wherein:

the memory cell is a one-transistor EPROM cell.

21. The circuit of claim 17, wherein:

the memory cell is a one-transistor EEPROM cell.

22. The circuit of claim 17, wherein:

the select circuit includes at least one clamp limited IGFET, the source-drain path of the clamp limited IGFET forming a first portion of the controllable impedance path, the gate of the clamp limited IGFET being coupled to the clamp node.

23. The circuit of claim 22, wherein:

the clamp IGFET is an n-channel IGFET.

24. The circuit of claim 22, wherein:

the select circuit further includes a plurality of select IGFETs connected in series between the clamp IGFET and the p-n junction of the memory cell, the source-drain paths of the select IGFETs forming a second portion of the controllable impedance path, the gates of the select IGFETs being driven in response to externally applied address signals.

25. The circuit of claim 17, wherein:

the clamping p-n junction includes at least one dummy memory cell.

26. The circuit of claim 25, wherein:

the at least one dummy memory cell includes a source region and a drain region, the drain region forming the clamping p-n junction.

27. The circuit of claim 17, wherein:

the memory cell includes a floating gate.

28. The circuit of claim 17, wherein:

the clamping p-n junction includes a plurality of dummy memory cells coupled in parallel to one another.

29. A circuit for applying an erase voltage to memory cells in a nonvolatile memory device, the circuit comprising:

an erase node;

at least one memory cell having a p-n junction coupled to the erase node;

a clamp node;

an erase enable circuit coupled between the erase node and the clamp node, the erase enable circuit including a controllable impedance path;

an erase voltage supply node coupled to the clamp node; and a clamping p-n junction coupled to the clamp node.

30. The circuit of claim 29, wherein:

the at least one memory cell includes a source region and a drain region, the source region forming the memory cell p-n junction.

31. The circuit of claim 29, wherein:

the at least one memory cell includes a floating gate.

32. The circuit of claim 29, wherein:

the p-n junction of the at least one memory cell is formed by an n-type semiconductor region formed within a p-type semiconductor region.

33. The circuit of claim 29, wherein:

the at least one memory cell is a one-transistor electrically erasable and programmable read only memory (EEPROM) cell.

34. The circuit of claim 33, further including:

a plurality of the memory cells, each memory cell having a source and a drain, the sources of the memory cells each forming a p-n junction, and being commonly coupled to the erase node.

35. The circuit of claim 29, wherein:

the erase enable circuit includes at least one insulated gate field effect transistor (IGFET) having a source-drain path disposed between the clamping node and the p-n junction of the memory cell.

36. The circuit of claim 29, wherein:

the erase enable circuit includes a driver circuit having a first drive IGFET of a first conductivity type having a drain coupled to the erase node and a gate coupled to a drive control node, and a second drive IGFET of a second conductivity type having a drain coupled to the erase node, a source coupled to the erase voltage supply node and a gate coupled to the drive control node, the source-drain path of the first drive IGFET forming a first portion of the controllable impedance path.

37. The circuit of claim 29, wherein:

the clamping p-n junction includes at least one dummy memory cell.

38. The circuit of claim 37, wherein:

the at least one dummy memory cell includes a source region and a drain region, the source region forming the clamping p-n junction.

39. The circuit of claim 37, wherein:

the at least one dummy memory cell includes a floating gate.

40. The circuit of claim 29, wherein:

the clamping p-n junction includes a plurality of dummy memory cells coupled in parallel to one another.

* * * * *